United States Patent [19]

Owechko et al.

[11] Patent Number: 4,961,615
[45] Date of Patent: Oct. 9, 1990

[54] ASSOCIATIVE MEMORY SYSTEM WITH SPATIAL LIGHT MODULATOR

[75] Inventors: Yuri Owechko, Newbury Park; Bernard H. Soffer, Pacific Palisades, both of Calif.

[73] Assignee: Hughes Aircraft Company, Los Angeles, Calif.

[21] Appl. No.: 356,808

[22] Filed: May 24, 1989

Related U.S. Application Data

[62] Division of Ser. No. 64,979, Jun. 19, 1987, Pat. No. 4,860,253.

[51] Int. Cl.$^5$ .............................................. G03H 1/12
[52] U.S. Cl. .................................. 350/3.68; 350/3.82; 350/162.13
[58] Field of Search ..................... 350/3.67, 3.68, 3.81, 350/3.82, 3.83, 162.12, 162.13, 162.14

[56] References Cited

U.S. PATENT DOCUMENTS

| | | | |
|---|---|---|---|
| 4,546,248 | 10/1985 | Craig | 250/225 |
| 4,556,986 | 12/1985 | Craig | 356/345 |
| 4,707,077 | 11/1987 | Marom | 350/162.12 |
| 4,739,496 | 4/1988 | Marom et al. | 350/3.6 |
| 4,750,153 | 6/1988 | Owechko et al. | 350/3.6 |
| 4,860,253 | 8/1989 | Owechko et al. | 350/3.6 |

*Primary Examiner*—Bruce Y. Arnold
*Assistant Examiner*—J. P. Ryan
*Attorney, Agent, or Firm*—V. D. Duraiswamy; W. K. Denson-Low

[57] ABSTRACT

An associative memory system is provided which incorporates a spatial light modulator (SLM) and thresholding components. In the preferred embodiment, a Fourier transform hologram is used to convolve a reference beam with correlated input images and stored object images. An iteration and feedback loop is provided which is used to derive an enhanced reference beam for use in matching and enhancing the associative memory of the hologram with the object input plane image. The iteration loop of SLM and optical amplifying components comprises a liquid crystal light valve (LCLV) which receives the correlation plane image and provides that image in the form of a spatially phase-modulated and amplitude modulated signal to a polarizing thresholding analyzer device. The analyzer/polarizer is adjustable and threshold limits the data at fast rates and, is used in the preferred embodiment to threshold the data with reference to the greatest amplitude portion of the correlation spot provided to the LCLV. After the optical analyzer/polarizer threshold has processed the signal, an improved signal is provided to the writing photoconductor side of the LCLV. This processed signal is used to phase-modulate a projection light readout beam. A polarizing beam splitter converts the phase modulation of the readout beam to an amplitude modulation wherein an enhanced reference beam is derived which is processed back to the hologram for readout at the output plane of the system. In this manner a variable-gain fast response spatial light modulator component system is provided for use as an associative memory.

3 Claims, 2 Drawing Sheets

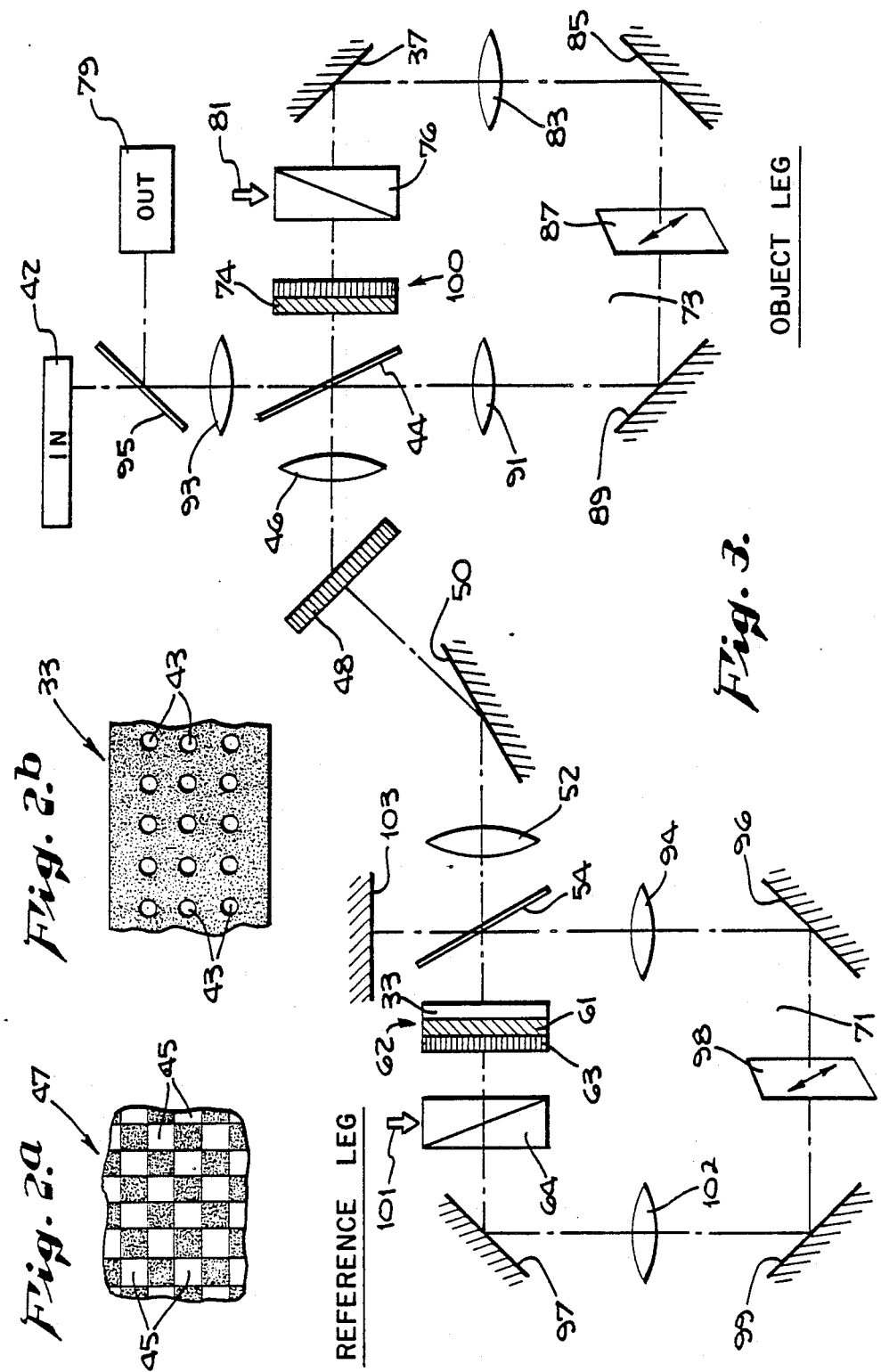

ASSOCIATIVE MEMORY SYSTEM WITH SPATIAL LIGHT MODULATOR

This is a division of application Ser. No. 064,979, filed June 19, 1987 now U.S. Pat. No. 4,860,253.

FIELD OF THE INVENTION

This Invention relates to Associative Memory Systems and in particular to Associative Memory Systems using spatial light modulators (SLM) such as liquid crystal light valves (LCLV).

BACKGROUND OF THE INVENTION

The speed and computational accuracy of modern digital computers are well-known. However, all digital computers solve problems in a sequential fashion through the use of numerical computation. While the processing unit contained in a simple pocket calculator can easily out-perform the human brain in number crunching tasks, digital computers are able to accomplish this sophisticated numerical analysis only on a step-by-step basis. Digital computers exhibit their best abilities when presented with a serially programmable algorithm. Digital computers are not capable of sophisticated parallel processing, such as that required when a human undertakes the task of pattern recognition. Problems such as comparing the fingerprint found at the scene of a crime with a data base full of fingerprints is the sort of practical and necessary problem that arises and yet is not easily solved by a digital computer. To the extent that digital computers have been programmed to match the fingerprint found at the scene of the crime with an existing fingerprint in the files, lengthy serial searches of memory are required to digitally achieve accurate pattern recognition.

A matrix algebra based on an associative memory model was described by J. J. Hopfield in his paper "Neural Networks and Physical Systems with Emergent Collective Computational Abilities," proceedings of the National Academy of Science U.S.A., 1982, Vol. 79, pp. 2554–2558. The Hopfield model utilizes feedback and nonlinear thresholding to force the output pattern to be the stored pattern which most closely matches an input pattern presented to the associative memory system. A digital emulation of this model requires large storage and computational effort for the manipulation of an association matrix used in the model. For example, in order to store two-dimensional image patterns consisting of $N \times N$ pixels, the model requires a matrix with $N^4$ entries be used.

A natural implementation of an associative memory model would be one which uses optical technology. Optical associative memory systems store information as patterns; so that, upon the introduction of a stored pattern to the system,. the system is able to recall the stored pattern and perform a match. These Optical systems achieve massive parallel processing. The ability of an optical associative memory to perform such a function has wide application in the fields of pattern recognition and image understanding. Used in conjunction with a laser beam, specially treated photosensitive film or plates act as holograms. A hologram is a frozen "picture" of an object wherein the image of the object is recorded on the film plate as an interference pattern between a reference beam of plane waves (which is directed only at the photographic film) and an object wave front (which is created by reflection from the object, where the object wave front is made by the same coherent source that produced the reference beam). Holograms are characterized as having extremely good spatial coherence. The light used to produce the hologram, normally a laser beam, exhibits a high degree of temporal coherence. In order to view the recorded holographic image, one redirects coherent light along the same path as the reference beam which originally recorded the hologram. A viewer views the hologram along the same line of sight that connected the object and the hologram during its recording. Directing a new reference beam on the hologram causes an image to appear which, in a lensless environment, gives rise to a three-dimensional image. The lifelike dimensionality of a lensless image produced in a hologram is due to the fact that, unlike a photograph, a hologram stores not only amplitude changes but also records phase changes as interference fringes resulting from the interaction between spatially coherent object and reference beams.

Holograms are characterized by very precise and lifelike imaging. In addition, a hologram, when viewed from different angles, produces different views of the recorded image. The hologram is programmable for use in storing a plurality of images, by varying the angle of the reference beam used to record the image. The information stored within a hologram is recorded throughout the holographic medium; even a portion of the hologram retains the complete record. It therefore can be seen that holograms are quite useful in parallel processing systems. Furthermore, holograms are inherently useful for optical pattern recognition mechanisms.

Among the types of holograms known in the art are the volume, Fresnel, and Fraunhofer holograms. The volume holograms have a thickness and can be used to record either amplitude or phase modulated images without the generation of both primary and conjugate waves that is inherent with thin holograms. Fraunhofer holograms are characterized as holograms that record distant objects. Larger and closer positioned objects produce Fresnel holograms.

The Fourier transform hologram uses a lens and is adaptable for memory storage purposes. As is well known in the numerical analysis arts, the Fourier transform is a mathematical tool wherein any function may be broken up into a sum of sinusoidal superimposed patterns. This manner of dividing a function into its Fourier components is known as defining the Fourier transform of a function. In Fourier transform holography, one captures an object's wave front holographically, after it has undergone a Fourier transformation. To do this, one places a photographic holographic plate at the back focal plane of the lens. A flat object, such as a transparency, is placed at the same distance in front of the lens as the photographic plate is behind it. The object's wave front, when it reaches the plate, has been Fourier-transformed by the lens. The holographic pattern produced as an image is quite unlike the original object. If the object is illuminated only by coherent light, such as a laser beam, and if a reference beam is provided at an angle to the plate, the Fourier transform can be recorded as a hologram.

Pattern recognition has used Fourier transform holograms in another fashion to perform the operation of convolution. The best way to understand convolution is to look at an example. If one were to convolve a first transparency having three dots with a second transparency having one triangle, using a holographic Fourier transform, one obtains three triangles, one at each position of the dots. A related operation mathematically similar to convolution is correlation. The result of correlating two identical objects is a sharp peak at a position corresponding to the shift value which superimposes the two objects. The peak is greatly reduced if the two objects are not identical, making correlation useful in pattern recognition.

To correlate two transparencies (also referred to as objects) one simply positions a first object one focal length in front of a lens and a Fourier transform hologram of a second object one focal length back of this lens. A second lens is positioned in back of the Fourier transform hologram of the second object. The correlation of the first and second objects appears one focal length behind the second lens.

An example of optical pattern recognition using correlation would be where in a printed page of text one could recognize a particular word or letter at some position on a page. Wherever the particular word appears in the text, a bright spot of light highlights the word in the correlated image. Wherever the word occurs on the page, there will be a corresponding bright spot of light in the correlated image called a correlation peak. Thus, the nature of holograms an lenses combined in an optical system using a coherent light source allows the operation of pattern recognition to occur. Such a device has been characterized as an optical neural computer. The term "neural" is derived from the fact that the parallel processing of a hologram to provide an associative memory is similar to that of a human brain's neural system in that the stored information is not localized.

Heretofore, one such optical associative memory has been proposed by Abu-Mostafa and Psaltis in *Scientific American*, vol. 256, no. 3 in an article entitled "Optical Neural Computers," at page 88 (March, 1987). In that article an optical thresholding device and a pinhole array were used as part of a double hologram associative memory system.

The applicants have previously disclosed (as co-inventors) in a prior patent an associative memory system entitled "ASSOCIATIVE HOLOGRAPHIC MEMORY APPARATUS EMPLOYING PHASE CONJUGATE MIRRORS", U.S. Pat. No. 4,739,496. Also, the applicants are co-inventors in a now pending application "ASSOCIATIVE HOLOGRAPHIC MEMORY APPARATUS EMPLOYING PHASE CONJUGATE MIRRORS IN A TWO-WAVE WAVE MIXING CONTRA-DIRECTIONAL COHERENT IMAGE AMPLIFIER", U.S. Pat. No. 4,750,153. (The disclosures contained in both patents are hereby incorporated by reference.) Hughes Aircraft company, the assignee of this application, is also the assignee of these two patents. These systems also employ primarily all-optical elements.

As indicated above, optical elements, such as the hologram, make excellent associative memory storage devices. When a distorted input image is presented to a system which includes at least one hologram (containing a clear representation of that image), the system processes light through its components in such a manner as to correlate and match the distorted input image with one of the images stored on the hologram. The sharper the correlation peaks, the better the match. All optical systems are excellent parallel processors but generally may not be shift-invariant and furthermore, they may exhibit optical and gain losses in the system as the image is processed. In order to achieve a good match, an optical associative memory must have good thresholding and gain so that the correlation peak which reconstructs the reference beam (when the image is to be reconstructed) is sharp and bright. Losses of light intensity in the system are inevitable as the light is processed through an optical system as disclosed in the above-incorporated applications or as that disclosed in the Abu-Mostafa article, *supra*. Additionally, reconstruction and phase conjugation of the reference beam in the all-optical systems described in U.S. Pat. Nos. 4,739,496 and 4,750,153, is achieved inherently by use of phase conjugate mirrors, (PCMs) using for example $BaTiO_3$ material. In such systems, thresholding is determined by physical processes in the PCMs and is not easily alterable nor readily adjustable. Also, such optical systems heretofore have required at least a second for the PCM to respond. $BaTiO_3$-based optical techniques are relatively slow, in a computer sense. Phase conjugate mirrors of an all-optical component system may be used to fully reconstruct and return an image to its point of origin to achieve pattern recognition. Non-linearities in the phase conjugate mirrors are used to select those stored objects which exceed a threshold, based on the overlap of computed integrals of the object input with the stored objects. Although, experimentally, store-and-recall of two objects with shift invariance, was achieved, the gains achieved by phase conjugate mirrors were not enough to overcome hologram losses. Additionally, the non-linearities of the phase conjugate mirrors were difficult to control.

It is therefore an object of this invention to provide a system which makes use of the pattern recognition properties of a hologram but in such a manner that optical losses are kept to a minimum, thresholding with gain achieved, and sharp correlation of images at the hologram accomplished, with shift invariance. U.S. Pat. Nos. 4,546,248 and 4,556,986, both issued to Glenn D. Craig and assigned to the United States (NASA), disclose electro-optical systems used to process images with incoherent light sources. The systems represent attempts to vary spatially the optical gain of signals without thresholding or enhancement of optical images. Such references show the state of the electro-optical art, but do not in themselves advance the achievement of the objects of this invention to provide an associative memory system.

Liquid crystal light valves (LCLVs) suitable for use in the present invention include, for example, those shown in the following U.S. patents all assigned to Hughes Aircraft Company, the assignee of the present invention:

U.S. Pat. No. 3,824,002, "Alternating Current Liquid Crystal Light Valve", issued to T. D. Beard, on July 16, 1974; U.S. Pat. No. 4,019,807, "Reflective Liquid Crystal Light Valve with Hybrid Field Effect Mode", issued to Boswell et al. on Apr, 26, 1977;

U.S. Pat. No. 4,018,509, for "Optical Data Processing system with Reflective Liquid Crystal Light Valve", issued to Boswell et al. on Apr. 19, 1977;

U.S. Pat. No. 4,378,955, for "Method and Apparatus for a Multimode Image Display with a Liquid Crystal Light Valve", issued to Bleha et al. on Apr. 5, 1983;

U.S. Pat. No. 4,239,348, "High Resolution AC Silicon MOS-Light Valve Substrate" issued to J. Grinberg et al. on Dec. 16, 1980;

U.S. Pat. No. 4,443,064 "High Resolution AC Silicon MOS-Light Valve Substrate" issued to J. Grinberg et al. on Apr. 17, 1984; and, U.S. Pat. No. 4,127,322, "High Brightness Full Color Image Light Valve Projection System", issued to Jacobson et al., on Nov. 28, 1978.

SUMMARY OF THE INVENTION

An associative memory system capable of recalling a complete and undistorted stored image when the memory system is provided with an input image which is distorted (or is a part of the complete stored image or both) is disclosed. Such an input image is hereinbelow referred to as a "distorted image." The associative memory system of this invention includes a holographic means for recording and reconstructing a first object transform of a first object. Image transforming apparatus, such as a lens, provides a second transform of a second object or set of second objects to the holographic means. The holographic means forms the product of the transforms of the first object, second object, and the first reference beam used in recording the hologram. This composite product, known as a distorted second reference beam, is transformed by a correlation lens into a correlation function which is the transform of the product. The correlation function is threshold limited and conjugated by spatial light modulator means which feeds back the threshold limited conjugate correlation back to the holographic means for reading out the first object transform stored therein. An image then appears in the output plane as a reconstructed first object.

In present preferred embodiment, the spatial light modulator (SLM) means comprises a liquid crystal light valve (LCLV) means.

The liquid crystal light valve (LCLV) means is electronically controllable and modulates a readout beam in accordance with the correlation function incident on the photoconductor side of the LCLV. The modulated readout beam is then fed back to the holographic means.

A second leg of the system may be provided wherein a second LCLV receives a focused image from the hologram. This second LCLV modulates a second readout beam using a polarizing beam splitter. When the beam splitter is illuminated by the bright readout beam, an enhanced, and amplified object beam resonates within the memory system, providing a truer match on the holographic plate.

The processing of data, for pattern recognition purposes, accomplished by the associative memory of the present inventive system may be generalized as an associative memory system where a first body of data is transformed and is recorded within a memory storage means, such as a hologram, using transforms (plane or spherical waves) of a reference set of data (delta functions) and the memory system is presented with a second incomplete body of data (that is, the distorted input image). For example, the nature of the transformation may be a Fourier transform. A second transform set of data corresponding to the second body of data is provided to the hologram. The hologram, in conjunction with a correlation device, generates the correlations of the first and second bodies of data. Such a generalized model also includes a liquid crystal means for conjugating and thresholding this correlation function. This improved correlation function is transformed as an enhanced reference beam which is then presented to the data storage area where the data store in the system is kept. This results in the reconstruction of the first body of data.

An associative processing occurs wherein the transformed data storage combines and correlates these first stored and transformed set of data with the second transformed input data and the reference data to form the composite product set of data, whereby a first stored body of data is associated with a second incomplete body of data. In applicant's presently preferred embodiment, the parallel processing and pattern recognition are accomplished optically, and thresholding and gain are accomplished electro-optically using LCLV means.

BRIEF DESCRIPTION OF THE DRAWINGS

FIG. 2 (a) shows the configuration of the grid component 47 like the grid of FIG. 1 in greater detail.

FIG. 2 (b) shows a plan view of the grid 33 of FIG. 1 in enlarged detail.

FIG. 3 shows a resonator associative memory system in accordance with a preferred embodiment of this invention.

DETAILED DESCRIPTION OF THE PREFERRED EMBODIMENT

Figure 1:
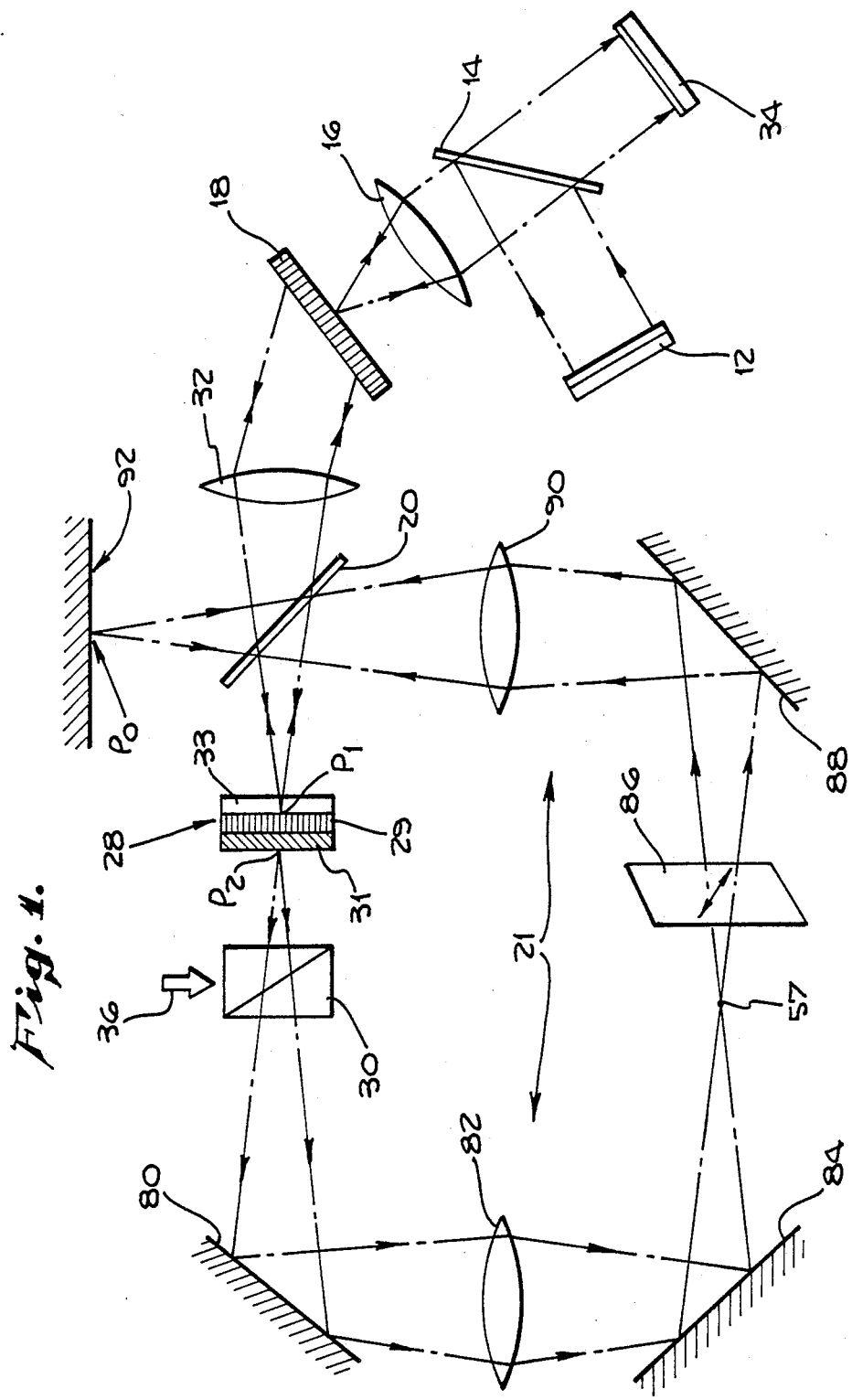
FIG. 1 shows a simplified first embodiment of one presently preferred embodiment of the associative memory of this invention using a liquid crystal light valve.

With reference to FIG. 1 the preferred embodiment of the invention of this application is generally shown and may operate in a first recording mode and a second reconstruction mode. This description details the associative memory system operating in the reconstruction mode. A hologram 18 has stored within it at least two coherent wave amplitudes generated by at least two different objects. The hologram 18 carries within its light-sensitive medium both phase and amplitude information with regard to the objects stored therein. The particular hologram 18 which is described in detail in the following description is a Fourier transform hologram. However a Fresnel or a volume hologram can also be used. Utilizing a Fresnel or a volume hologram will, however, result in the loss of shift invariance, which is an important advantage of the Fourier transform hologram. By "shift invariance", it is meant that an object will be recognized and reconstructed regardless of its position in the input plane.

When the hologram 18 is irradiated by a complex wave front which is a distorted version of the stored image, the hologram 18 may be used in conjunction with the other components of the system, to match the incomplete input image with the stored image on the hologram 18.

The distorted image is provided to the associative memory system by the object input plane 12. Light from the object input plane 12 is directed at the beam splitter 14. The beam splitter 14 redirects light from the object input plane 12 to the Fourier transform lens 16. It will be noted that the object input plane 12 is one focal length distance in front of the Fourier transform lens 16. The hologram 18 is one focal length in back of the Fourier transform lens 16. A composite product beam (which is a collection of distorted reference beams, hereinafter referred to as "distorted reference beam") is generated by the object wave front incident on the hologram, and is provided through the correlation lens 32. The correlation lens 32 is in back of the hologram 18.

The composite product or distorted reference beam is provided to the beam splitter 20. This distorted reference light beam is then provided through the alignment grid 33 to the photoconductor side 29 of the liquid crystal light valve (LCLV) 28, which is one focal length in back of the correlation lens 32. The image received by the LCLV 28 may be characterized as the correlation of the stored image of the object, stored within the hologram 18, and the distorted input image from the object input plane 12.

In simplified mathematical terms, let
a=an object "a";
A=a Fourier transform of the object "a" stored within the hologram 18;
b=a reference "b", the Fourier transform of which, B, is also stored in the hologram 18.

The quantities A and B are in general complex. Then, the amplitude transmittance of the hologram 18 is proportional to the magnitude squared of the sum of A and B or $|A+B|^2$.

If now a distorted input image a' is provided by way of the Fourier transform lens 16 to the hologram 18, a transformed input image A' is presented to the hologram 18. A Fourier transform hologram 18, when arranged in a system as shown in FIG. 1, gives rise to the correlation of the distorted image a' with the quantity a which is in turn convolved with b.

It is well known that the convolution of two functions in the spatial domain equals the product of the Fourier transforms of each function in the spatial frequency domain. The symbol "*" is used herein to indicate convolution, then, b * (a' * a) means b convolved with the quantity consisting of the correlation ( * *) of a' with a.

In the spatial frequency domain, the amplitude transmitted by the developed hologram is proportional to the expression $A'|A+B|^2$. If one were to expand this product, one would derive the following expression:

$$A'(A^2 + A\underline{B} + B^2 + B\underline{A}).$$

Rearranging these terms, one would obtain the following expression:

$$A'(A^2 + B^2) + A'(B\underline{A}) + A'(\underline{A}B),$$

where $\underline{A}$ is the complex conjugate of A and $\underline{B}$ is the complex conjugate of B.

The first two terms of this expression, are respectively, the zero order term and the order term and the −1 order term, neither of which are of direct concern to this invention; however, the last term, A' (AB) is one which is important to this invention. B is a tilted plane wave, and this plane wave is derived from a reference b, which is a shifted delta function. Therefore, in the spatial domain, the quantity b*(a' * a) represents a shifted version of the correlation of the distorted input image a' with the stored a. FIG. 1 shows that the above quantity is present simultaneously at the liquid crystal (31) and photoconductor 29 sides of the liquid crystal light valve (LCLV) 28.

The above mathematical results are in keeping with what is experimentally observed in optical systems. If a first object is placed one focal length in front of a Fourier transform lens and a Fourier transform hologram of a second object is placed in back of the same Fourier transform lens by one focal length; then, a second lens is positioned one focal length behind the Fourier transform hologram of the second object, a screen which is one additional focal length behind the second lens will produce a correlated and convolved image of the first object and the second object which is stored in the Fourier transform hologram. If the stored image transform B is the Fourier transform of a delta function b, (i.e. a tilted plane wave), then the remaining terms of interest A' (A) in the frequency domain correspond to the spatial domain correlation of input image a, with the stored image a. These relationships of association arise intrinsically when a Fourier transform hologram 18 is used within an associative memory as shown in FIG. 1. The correlated images, as stated hereinbefore, are provided by the beam splitter 20 to the photoconductor side 29 of the liquid crystal light valve 28. This correlation image is then presented as writing light to a spatial light modulator, which is a liquid crystal light valve 28 in the preferred embodiment. The liquid crystal light valve is an optical-to-optical image transducer that is capable of accepting a low intensity input light image and converting it, in real time, to an output image with light from another source. The device is designed so that the input and output light beams are completely separated and non-interacting. Other spatial light modulators such as magneto-optic modulators or multiple quantum well heterostructure modulators may also be used.

One of the significant aspects of the invention and system disclosed in this application is the manner in which the correlated image provided to the thresholded and conjugated liquid crystal light valve 28 is enhanced by the feedback loop 21. A feedback arrangement of mirrors and lenses such as that described by U. H. Gerlach et al., ("Single-Spatial Light Modulator Bistable Optical Matrix Device Using Optical Feedback", Optical Engineering, Volume 19, No. 4, July–August 1980, pp. 452–455) may be suitably modified and used to feedback the modulated readout beam to the hologram.

The LCLV is preferably operated in the forward slope mode and a positive feedback loop is established using the feedback arrangement which images the liquid crystal side 31 of LCLV 28 onto the photoconductor side 29 with unity magnification and in registration. Lens 32, which is one focal length away from both the mirror 92 and the LCLV photoconductor 29, images the Fourier transform of the input on mirror 92 and the photoconductor 29. The Fourier transform can be assumed to consist of a set of spots. Because of the positive feedback loop, spots above the threshold level will latch at the full intensity level of the readout light. These spots will be output colinearly with the input. A large gain between the input 12 and the output 34 is possible.

The phase of the Fourier transform of the distorted reference will be lost in this configuration. However, it is not important in an associative memory system application since each referenced beam reads out the hologram 18 separately. Each of the superimposed holograms is incoherent with respect to other recorded images. Thus, this invention can function in the reference leg (FIG. 1 and 71 of FIG. 3) of the associative memory as a high gain pseudo-conjugator with an adjustable threshold. The light in the feedback loop 21 (FIG. 1) is polarized so the threshold level can be adjusted by varying the polarizer 86 orientation.

The image presented to the photoconductor 29 side of LCLV 28 by the correlation lens 32 and the beam splitter 20 has partially distorted spurious light associated with this correlated image due to the input of an imperfect real time image from the object input plane 12. In order to remove distortions and provide a threshold value of amplitude intensity of the optical signal to the system, the distorted correlation image incident on photoconductor side of the LCLV 28 modulates a readout beam 36 incident on the liquid crystal side 31. The modulated readout beam is fed back through a feedback arrangement of mirrors and lenses. The modulated readout beam proceeds from the polarizing beam splitter 30 as an amplitude modulated signal onto mirror 80. This modulated readout beam diverges until it reaches imaging lens 82. Imaging lens 82 causes this signal to converge as the modulated readout beam is reflected off mirror 84. The readout beam full converges at imaging point 57 where the image is inverted and begins to diverge as it passes through adjustable polarizer 86. As the beam passes through adjustable polarizer 86, it is reflected off the surface of mirror 88 and fully diverges onto imaging lens 90. Imaging lens 90 then causes the iterating modulated readout beam to converge onto point $P_0$ of the mirror 92. It is important that the mirror 92 be orthogonal to a line connecting the mirror 92 and the imaging lens 90. The beam splitter 20 then receives the reflected image from point $P_0$ and passes that reflected image onto the hologram 18, by way of the correlation lens 32, as well as back to converging point $P_1$ for another feedback iteration through loop 21. This enhanced beam then serves to phase modulate a newly diverging beam which originates at point $P_2$. This phase modulated beam, when passed through the polarizing beam splitter 30, amplitude modulates the new readout beam 36 and the process of positive feedback through the iteration loop 21 is repeated again. Each interaction assures yet a more enhanced and stable output signal, which may be read at the output plane 34. The light intensity of the correlation image presented to the photoconductive side 29 of the LCLV 28 which is above a threshold intensity will be enhanced by feedback, whereas portions of the correlation image with an intensity below threshold is eliminated or made negligible. In other words, if the image on the hologram LCLV 28 is partially distorted, such as that of a circle having flares or wings, these flares or wings at the outer portions of the correlation are clipped, so that the adjustable thresholding provided by the LCLV 28 results in a smooth, round correlation image. The liquid crystal light valve (LCLV) 28 operates to modulate the phase of the readout beam 36 according to the control provided by the writing light. The polarizing beam splitter 30 directs the high intensity coherent readout beam 36 to the LCLV 28 (liquid crystal side 31) and converts the phase modulation of the reflected modulated readout beam into amplitude modulation.

The polarizing beam splitter 30 provides half its signal back to the hologram 18 along the feedback loop 21 to the hologram 18 shown in FIG. 1. By operation of the liquid crystal light valve 28 (LCLV), a stronger signal is provided to the hologram 18. This signal processing assures sharper and clearer correlation of the image from the object input plane 12 with a stored image of the hologram 18, for viewing at the output plane 34.

The feedback loop can be repetitively performed until a stable thresholded conjugated signal is obtained. This signal reads out the hologram. The positive feedback mode enhances the nonlinear operating characteristics of the LCLV which, in turn, improves the thresholding capability of the LCLV. Furthermore, the inherent bistable characteristic results in a stable output, that is the modulated readout beam continues even after the original input to the photoconductor side switched off. Therefore, once the input image is fed to the photoconductor side 29 of the LCLV and the input image is "latched" onto, it can remain "latched" even if the input image is thereafter turned "off", until the latched input image is deliberately unlatched.

It will be noted that the optical conjugation and threshold effect achieved in the preferred embodiment uses an LCLV to phase-modulate the readout beam 36. Alternatively, phase-modulation of the readout beam 36 could be achieved by use of a spatial light modulator (SLM) 28 such as a Microchannel SLM or other electro-optical structure which is optically addressable.

Thus, many variations of existing SLMs may be used in the system disclosed herein to modulate the readout beam 36, and some of these variations of the SLM would allow a reduction in the number and type of elements essential to the functioning of the iteration loop 21.

An additional feature of the invention which is useful to the alignment procedure necessary in the reference leg of the preferred embodiment of this invention (all of FIG. 1 and the reference leg of FIG. 3) is shown at FIGS. 2 (a) and FIG. 2 (b). FIG. 2 (b) shows a preferred grid 33 of FIG. 1 magnified. It will be noted that the grid 33 is a half tone mask which is placed against the photo conductor side 29 (of FIG. 1) of the LCLV 28. It will be noted that in the preferred embodiment of the grid 33, circular apertures 43 are spaced in a uniformed matrix configuration to provide proper alignment of the $P_1$ input image to point $P_1$ of the LCLV 28 (FIG. 1).

Alternatively, FIG. 2 (a) shows a grid 47 having a checker-board pattern of square-shaped apertures 45 which are alternately spaced along the grid to provide alignment for the input image to the LCLV of the reference leg. Ordinarily, if the alignment between the image on the photoconductor side 29 and the liquid crystal side 31 of the LCLV 28 (FIG. 1) is not perfect, or if the magnification is not unity, then threshold limited image is not stable and may grow to fill the entire field of view. To avoid this problem and to enhance the misalignment tolerance so that it may be greatly increased, a grid such as 33 or 47 is used so as to confine blooming to within each clear aperture, such as apertures 43 of FIG. 2 (b) and 45 of FIG. 2 (a). Thus, it is possible to trade off space bandwidth product for alignment ease by using larger period grids such as 47 and 33.

FIG. 3 shows an LCLV based optical associative memory system in a resonator configuration. A distorted image is input at the input plane 42 to a beam splitter 44. A portion of the image from the input plane 42 is imaged onto the photoconductor side 74 of LCLV 100 of the feedback system. This activates LCLV 100 which in turn modulates the phase of readout beam 81. Polarizing beam splitter 76 converts this phase modulation into amplitude modulation. The modulated readout beam is then directed through a system of lenses and mirrors. The Fourier transform lens 46 receives the modulated beam after the object leg iteration, and passes the enhanced signal onto the hologram 48, where the correlation of the input image is processed by a first iteration loop 71. A beam splitter 54 provides the photoconductor side 61 of a liquid crystal light valve 62 with a convolved and correlated image for further processing to eliminate losses and to provide thresholding.

The LCLV 62 phase-modulates a readout beam 101 which is then amplitude-modulated at the polarizing beam splitter 64. The output of the polarizing beam splitter 64 is presented back to the beam splitter 54 and the correlation lens 52, and passed by the mirror 50 back to the hologram 48. In the embodiment shown in FIG. 3, a resonator effect occurs because rather than reading out an image at the LCLV 74, the enhanced output image is now impressed upon the second iteration loop 73. The beam splitter 44 provides this enhanced image to the photoconductor side of LCLV 74. The image on the photoconductor side of LCLV 74 then phase-modulates the readout beam 81, which is projected through a polarizing beam splitter 76 and back to the Fourier transform lens 46 and the hologram 48. The enhanced signal continues to loop back and forth between the first iteration loop 71 and the second iteration loop 73 until the stable states of the overall system of the object and reference pairs stored in the hologram 48 are achieved.

The input image provided to this system by the input plane 42 is processed through beam splitter 95 and onto imaging lens 93, where the distorted input image is divided by the beam splitter 44. Beam splitter 44 simultaneously provides the input image to the liquid crystal light valve (LCLV) 74 of the object leg. After passing through the hologram 48, the mirror 50 provides the correlation lens 52 of the reference leg with a composite image ready to be enhanced by the referenced leg iteration loops 71. The light provided to the beam splitter 54 by the correlation lens 52 is focused onto the photoconductor portion 61 of the LCLV 62 after passing through the grid 33. This writing light serves to phase modulate the read out beam 101 that is presented to the liquid crystal portion 63 of the LCLV 62. The readout beam 101 is then amplitude modulated by the light present on the photoconnector 61 side of the LCLV 62 and begins its iteration around loop 71. The modulated readout beam is reflected off of mirror 97, passing through imaging lens 101 and onto mirror 99, where it is reflected through the adjustable polarizer 98 and reflected onto the surface of mirror 96. Mirror 96 then provides the modulated beam to the imaging lens 94 where the beam is provided back to the mirror 103. The modulated signal at this point reflects off of mirror 103 and back down to the beam splitter 54 where the light is then simultaneously presented back to the grid 33 and photoconductor surface 61 of the LCLV 62 of the reference leg and back through the correlation lens 52, so that the modulated beam may be presented to the hologram 48 in an enhanced manner for further processing in the object leg of the resonator configuration of FIG. 3.

This enhanced referenced beam is then presented by means of the Fourier transform lens 46 onto the LCLV 74 for writing a phase-modulation code suitable for phase-modulating the readout beam 81 as it impinges upon the polarizing beam splitter 76. Polarizing beam splitter 76 acts to amplitude modulate the read out beam 81 in a manner which corresponds to the phase-modulation occurring at the liquid crystal light valve due to the light falling on the photo conductor surface of the liquid crystal light valve 74 as enhanced by the referenced leg 71. The amplitude modulator readout beam, modulated in accordance to the manner determined by the LCLV 74, and the polarizing beam splitter 76, is reflected off the surface of mirror 37 and onto imaging lens 83. The light then iterates through the loop to the object leg loop 73 in a manner similar to the journey of the amplitude modulated readout beam of the reference leg 71.

From mirror 85, the amplitude modulated readout beam passes through the polarizer 87 where its threshold may be adjusted and then onto mirror 89 for imaging by lens 91. The amplitude modulated signal passes to the beam splitter 44 where it is carried through the imaging lens 93 and out for viewing at the output plane 79 as well as back to the hologram 48 for another iteration through the reference leg 91 so that the entire resonating cycle may commence again.

Thus, a continually enhanced image iterates first through the referenced leg 71 back to the hologram 48 and then through the object leg 93 where it is both viewed at the output plane 79 and represented at the hologram 48 for yet another feedback set of iterations. In this manner an enhanced and adjustable threshold limited signal is obtained for use by this associative memory system.

This nonlinear system will jump from object state to object state depending on the overlap of the input image with the stored objects. The less distorted the input image provided originally by the input plane 42, the more quickly will resonance occur and the system arrive at a stable state. A latching of the system will provide (at the output plane 79) an image which can be used to identify stored objects and display their real time position and velocity in both object and reference spaces.

It is understood that additional embodiments beyond those shown in the description of the preferred embodiment may be envisioned which reflect the spirit and function of the disclosed embodiments. Yet, it is desired that protection under the appended claims extends to equivalent designs. For example, the associative memory system of this invention may be thought of as one which is capable of associating a first body of data recorded within a memory storage means with a second incomplete body of data where there is need to use a reference set of data to perform an associate function. Such a data processing system could require that the reference set of data and a composite product set of data be enhanced. In such a system the reference set of data would be enhanced by an electronic data processing means capable of resolving, thresholding, and amplifying the reference set of data.

Variations of intensity or value of the correlated data may be computed for enhancing and averaging so that a correlated image with better resolution may be provided for the associative processing function. Such a system may perform associative conjugating functions through the use of acoustical holograms or related systems. Also, an electronically activated spatial light modulator (SLM) which allows an electronic signal to directly modulate the readout beam on the projection side of the SLM could be used in place of the LCLV disclosed.

Thus, not every element used in the preferred embodiment would be required to achieve controlled thresholding. Such an interchangeable choice of components is contemplated when determining the scope of the appended claims. Thus, the invention disclosed herein is not intended to be limited to the optically-oriented system disclosed herein.

What is claimed is:

1. A method of associating and reconstructing a stored image stored in a hologram, in response to an input distorted image containing a portion of the stored image, the method comprising:

(a) providing a transformed version of the input distorted image to said hologram so as to generate a distorted reference beam;
(b) converting the distorted reference beam into a correlation function;
(c) providing the correlation function to a first spatial light modulator for modulating a readout beam in response thereto;
(d) thresholding the modulated readout beam in a positive feedback loop using a polarizer;
(e) feeding back the thresholded modulated readout beam to the first spatial light modulator for pseudo-conjugation;
(f) repetitively performing steps (a) through (e) until latching occurs and a stable thresholded conjugated signal is obtained;
(g) reading out the hologram with the stable thresholded conjugated signal so that the stored image is reconstructed at an output.

2. The method of claim 1 further including after step (d):

(h) providing the thresholded modulated readout beam through the hologram to a second spatial light modulator to modulate a second readout beam;
(i) thresholding the second readout beam in a second positive feedback loop associated with the second spatial light modulator to generate a second thresholded beam;
(j) feeding the second thresholded beam back through the hologram to the first spatial light modulator; and
repeating the steps (a) through (d) and (h) through (j) until a stable resonant signal is obtained to read out the hologram and reconstruct the stored image at the output.

3. The method of claim 2 wherein the steps of providing to said first and second spatial light modulators comprises the steps of providing to first and second liquid crystal light valves (LCLVs) for pseudo-conjugation and amplification of the beams thus provided.

* * * * *